(12) United States Patent
Artmann et al.

(10) Patent No.: US 9,932,223 B2
(45) Date of Patent: Apr. 3, 2018

(54) METHOD FOR MANUFACTURING MICROELECTROMECHANICAL STRUCTURES IN A LAYER SEQUENCE AND A CORRESPONDING ELECTRONIC COMPONENT HAVING A MICROELECTROMECHANICAL STRUCTURE

(71) Applicant: Robert Bosch GmbH, Stuttgart (DE)

(72) Inventors: Hans Artmann, Boeblingen-Dagersheim (DE); Arnd Kaelberer, Schlierbach (DE); Christian Zielke, Eningen Unter Achaim (DE); Oliver Breitschaedel, Gomaringen (DE); Peter Borwin Staffeld, Stuttgart (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 15/097,331

(22) Filed: Apr. 13, 2016

(65) Prior Publication Data
US 2016/0304334 A1    Oct. 20, 2016

(30) Foreign Application Priority Data
Apr. 17, 2015    (DE) .................. 10 2015 206 996

(51) Int. Cl.
*B81C 1/00*    (2006.01)
(52) U.S. Cl.
CPC ... *B81C 1/00182* (2013.01); *B81B 2203/0118* (2013.01); *B81C 2201/014* (2013.01)

(58) Field of Classification Search
None
See application file for complete search history.

(56) References Cited

U.S. PATENT DOCUMENTS

2009/0206422 A1* 8/2009 Illing .................. B81C 1/00158
                                                                        257/419
2011/0056295 A1* 3/2011 Classen .................... B81B 7/02
                                                                        73/514.32

(Continued)

FOREIGN PATENT DOCUMENTS

DE    10 2006 032 195    1/2008
DE    10 2009 029 202    3/2011
DE    10 2009 045 385    4/2011

*Primary Examiner* — Peniel M Gumedzoe
*Assistant Examiner* — Christopher Johnson
(74) *Attorney, Agent, or Firm* — Norton Rose Fulbright US LLP; Gerard Messina

(57) ABSTRACT

A method for manufacturing microelectromechanical structures in a layer sequence and a corresponding electronic component having a microelectromechanical structure. The method includes provision of a carrier substrate including a first surface, an application of an insulation layer onto the first surface, an epitaxial growth of a first silicon layer onto the insulation layer, a structuring of the first silicon layer for forming trenches in the first silicon layer, a passivation of the first silicon layer, whereby the trenches are filled and a passivation layer is formed on a side facing away from the first surface, a structuring of the passivation layer, sacrificial areas and functional areas being formed in the first silicon layer, and the sacrificial areas are free of the passivation layer, at least at some points, on a side facing away from the carrier substrate, and, finally, removal of the sacrificial areas.

13 Claims, 7 Drawing Sheets

(56) References Cited

U.S. PATENT DOCUMENTS

| | | | | |
|---|---|---|---|---|
| 2013/0115775 A1* | 5/2013 | O'Brien | ............ | H01L 21/31111 438/702 |
| 2014/0318906 A1* | 10/2014 | Deimerly | ................ | B81B 7/008 188/156 |
| 2015/0028434 A1* | 1/2015 | Yoshida | ................ | B81B 3/0021 257/415 |

* cited by examiner

METHOD FOR MANUFACTURING MICROELECTROMECHANICAL STRUCTURES IN A LAYER SEQUENCE AND A CORRESPONDING ELECTRONIC COMPONENT HAVING A MICROELECTROMECHANICAL STRUCTURE

CROSS REFERENCE

The present application claims the benefit under 35 U.S.C. § 119 of German Patent Application No. 102015206996.6 filed on Apr. 17, 2015, which is expressly incorporated herein by reference in its entirety.

FIELD

The present invention relates to a method for manufacturing microelectromechanical structures in a layer sequence and to a corresponding electronic component having a microelectromechanical structure.

BACKGROUND INFORMATION

Although the method described here is applicable to any given microelectromechanical structures, the present invention and the problems addressed here will be explained with reference to MEMS structures ("microelectromechanical systems") based on silicon.

In particular for use in acceleration sensors or rotation rate sensors, which are based on capacitive measuring methods (capacitive MEMS), or in electrostatically driven microactuators (e.g., micromirror devices), microelectromechanical structures generally include one or multiple conductive functional layers, which contain stationary and movable areas. Movable areas are fixed, during manufacture, by a so-called sacrificial layer, which is selectively removed at the end of the manufacturing process.

A method for closing a trench of a micromechanical component is described in German Patent Application No. DE 10 2009 045 385 A1.

A method for forming sacrificial areas is described in U.S. Patent Application Publication No. 2013/0115775 A1.

A method for manufacturing MEMS structures is described in German Patent Application No. DE 10 2006 032 195 A1.

German Patent Application No. DE 10 2009 029 202 A1 describes a micromechanical system and a method for manufacturing a micromechanical system.

Manufacture of large sacrificial cavities is difficult, in particular, since, in particular, an undesirable deformation of a carrier substrate may result, for example, during deposition of correspondingly thick sacrificial layers. This undesirable deformation may be compensated for by complex and expensive additional stress-compensating layers.

SUMMARY

The present invention provides, in particular, a method for manufacturing, for example, complex MEMS structures having high effectiveness in a narrow space. In particular, the example method is suitable for manufacturing particularly small MEMS structures and, therefore, for complying with a required miniaturization.

In accordance with the present invention, in particular, multilayer MEMS function structures are created, having a large vertical extension, for example, greater than 50 micrometers, using the example method according to the present invention. In particular, an objective of the example method is to also make it possible to provide very large-volume sacrificial layer blocks or sacrificial layer areas, which may be accordingly removed again, and to create mechanical and electrical connections and separations freely and independently of one another.

The present invention provides, in particular, a CMOS- and high-temperature capable process for manufacturing multilayer MEMS structures from silicon. In this case, the functional areas as well as the sacrificial areas include the silicon. In this case, it is possible, in particular, to simultaneously structure functional areas and sacrificial areas in the same process step and to separate these from one another with the aid of passivation layers or insulation layers. The resultant sacrificial areas may be removed, for example, with the aid of gas phase etching after completion of the method for manufacturing microelectromechanical structures.

For example, the method is suitable for manufacturing multilayer systems having a large vertical extension and makes it possible to dispense with wafer bonding. Using the example method according to the present invention, the stacked, alternating layer sequences of silicon and passivation layer may be particularly precisely adjusted with respect to one another.

Every layer plane may be structured and configured independently of the planes lying above or below it. Functional areas, which are interlocked or overlapping, in particular with respect to a vertical extension, are also possible. Moreover, the method makes it possible, in particular, to freely define electrical connections/insulations and mechanical connections/insulations independently within the functional areas.

Areas of the silicon layer which are not to be etched are protected from the etching attack using passivation techniques such as, for example, thermal oxidation and/or tetraethyl orthosilicate (TEOS) deposition, silicon carbide (SiC) deposition, silicon carbon nitride (SiCN) deposition, silicon nitride ($Si_xN_y$) deposition, or silicon oxynitride (SiON) deposition. The areas of the silicon layer, i.e., the sacrificial areas, having access to the etching medium are etched completely, for example. For many applications, it is advantageous to remove an oxide passivation layer with the aid of HF gas phase etching after the removal or etching of the sacrificial areas.

According to one preferred refinement, the method steps of the epitaxial growth, structuring, and passivation of the first silicon layer and the structuring of the passivation layer are repeated prior to the removal of the sacrificial areas, and a formation of further sacrificial areas and further functional areas depends on the structuring of the further silicon layers and/or the further passivation layers. Therefore, a functional layer sequence may be easily manufactured. Furthermore, the stacked layers may be particularly precisely adjusted with respect to one another.

According to one further preferred refinement, after the removal of the sacrificial areas, a removal of the passivation layer is carried out, at least at some points. This is possible, since, due to the method according to the present invention, the functional areas may be advantageously completely fixed to one another. For example, the removal of the passivation layer or the oxide may be carried out using gas phase etching, plasma etching, and/or wet etching. In other words, the passivation layer may be removed particularly easily. In addition, the passivation layer or the oxide may be completely removed by the etching.

According to one further preferred refinement, the epitaxial growth of the first silicon layer takes place on an SOI substrate (silicon-on-insulator), or the SOI substrate includes the first silicon layer. In other words, the SOI substrate has a layer thickness, so that its uppermost silicon layer may function as the first silicon layer. This may have the advantage that the first silicon layer may be, in particular, monocrystalline. In addition, wiring layers, for example, are located on the insulating material of the SOI, whereby shorter switching times and lower power consumption, particularly with respect to leakage currents, result.

According to one further preferred refinement, the epitaxially grown silicon layer includes a monocrystalline, polycrystalline, and/or an epi-polycrystalline silicon layer. Epi-polycrystalline silicon layers are extremely thick polysilicon layers having thicknesses of up to several 10 micrometers. This may have the advantage that the example method according to the present invention may be utilized for a plurality of coating systems.

According to one further preferred refinement, a layer thickness of the epitaxially grown silicon layer is between 0.5 and 100 micrometers. Preferably, the layer has a thickness of 20 µm to 60 µm. In the present context, "thickness" is understood to be a vertical extension of a layer. "Vertical" is understood to be a direction, which extends transversely, in particular, perpendicularly with respect to a plane. In particular, large-volume sacrificial areas may be manufactured, whereby bending or deforming of the carrier substrate as a result of tensions ("stress") may simultaneously be prevented.

According to one further preferred refinement, the insulation layer functions as an etch-stop layer. In this case, it is advantageous, in particular, that the formation of trenches in the epitaxially grown silicon layer may be carried out particularly easily. By using etch-stop layers, complex and, in particular, highly variable, time-dependent etching methods, in particular, may be dispensed with.

According to one further preferred refinement, the formation of the trenches is carried out with the aid of a trench process. In this case, trenches, in particular, having a width of 1 to 4 micrometers are advantageous. These are passivated by a thermal oxidation and/or are closed or filled by a TEOS deposition. In addition, plasmaless etching methods may also be utilized. For example, plasmaless etching methods are advantageous in the case of epitaxially grown, thin silicon layers having a thickness of a few micrometers.

According to one further preferred refinement, the structuring of the passivation layer is carried out by a dry etching method and/or a wet etching method. It is therefore possible to remove the passivation layer easily, in particular, without having to revert to a specific etching method.

According to one further preferred refinement, after the epitaxial growth of the silicon layer, a chemical-mechanical polishing and/or an additional doping are carried out by implantation or diffusion. The topological irregularities or height differences resulting, in particular, during the epitaxial growth of the silicon layer may therefore be easily planarized. A special resistance may be easily set in the silicon layer by the additional doping by implantation or diffusion.

According to one further preferred refinement, the removal of the sacrificial areas is carried out by plasmaless and/or plasma-supported etching. The sacrificial areas may therefore be removed particularly easily without the use of special etching methods. The plasmaless etching may be carried out, for example, using chlorine trifluoride ($ClF_3$), chlorine fluoride (ClF), chlorine pentafluoride ($ClF_5$), bromine trifluoride ($BrF_3$), bromine pentafluoride ($BrF_5$), iodine pentafluoride ($IF_5$), iodine heptafluoride ($IF_7$), sulfur tetrafluoride ($SF_4$), xenon difluoride ($XeF_2$) or similar substances. The plasma-supported etching may be carried out, for example, using fluorine plasma, chlorine plasma, and/or bromine plasma. In particular, the etching may also be based on a combination of plasmaless and plasma-supported etching.

The features provided for the method described here also apply for an electronic component manufactured with the aid of this method, and vice versa.

BRIEF DESCRIPTION OF THE DRAWINGS

Further features and advantages of the present invention are explained below on the basis of specific embodiments, with reference to the figures.

DETAILED DESCRIPTION OF EXAMPLE EMBODIMENTS

Figure 1:
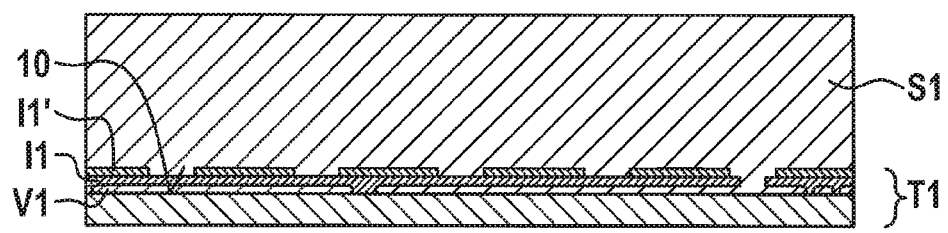
FIGS. 1 through 11 show schematic cross sectional views for explaining a method for manufacturing microelectromechanical structures in a layer sequence according to one specific embodiment of the present invention.

In the figures, identical or functionally identical elements are labeled using the same reference numerals.

FIGS. 1 through 11 show schematic cross sectional views for explaining a method for manufacturing microelectromechanical structures in a layer sequence according to one specific embodiment of the present invention.

In FIG. 1, reference numeral T1 labels a carrier substrate having a first surface 10. Insulation layers I1, I1' or dielectric layers, in particular, may be deposited on first surface 10 of carrier substrate T1. The carrier substrate or insulation layers I1, I1' from FIG. 1 further include a wiring layer V1.

A first silicon layer S1 is epitaxially grown on insulation layers I1, I1'. Epitaxially grown first silicon layer S1 may be undoped, p-doped, or n-doped. A thickness of first silicon layer S1 may be, for example, between a few hundred nanometers and greater than or equal to 100 micrometers. The thickness of the epitaxially grown silicon layer depends essentially on the desired height of a layer sequence, whereby each silicon layer S1 through S4 may be subdivided into sacrificial areas O1 and O4 and functional areas F1 through F4 (see FIGS. 9 through 11).

Furthermore, after the epitaxial growth of first silicon layer S1, a planarization of a topology or roughness may be carried out with the aid of CMP (chemical-mechanical polishing) and/or an additional doping for setting a special resistance.

Alternatively, an epitaxial growth of first silicon layer S1 may take place on an SOI (silicon-on-insulator), whereby the application of insulation layers I1, I1' may be unnecessary.

Figure 2:
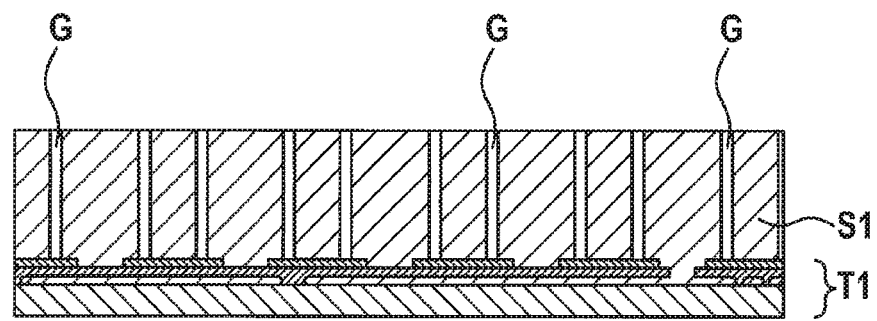

In FIG. 2, reference character G labels trenches. Trenches G may be formed using a trench process. Resultant trenches G are preferably situated above insulation layers I1, I1', where insulation layer I1' may be functioning, in particular, as an etch-stop layer.

Figure 3:
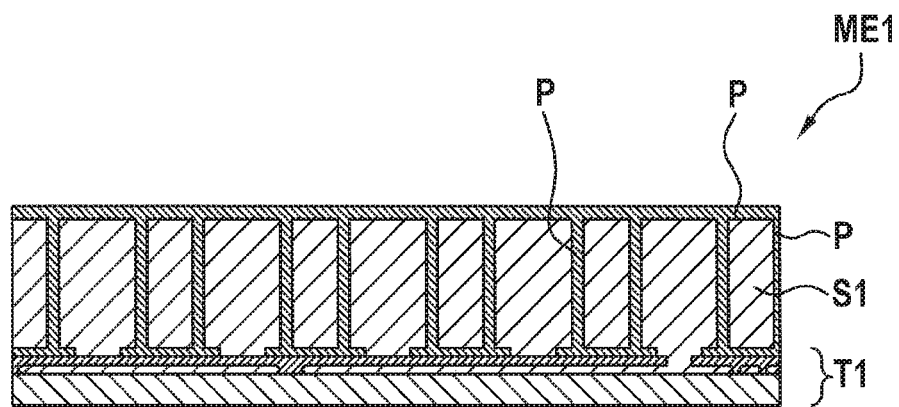

In FIG. 3, reference character P labels a passivation layer, which forms during a passivation of first silicon layer S1, trenches G being filled and a passivation layer P forming on a side facing away from first surface 10.

Figure 4:
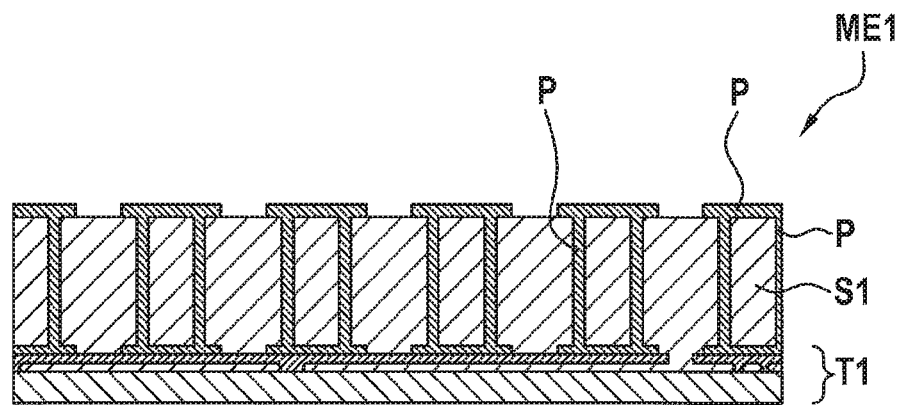
Figure 5:
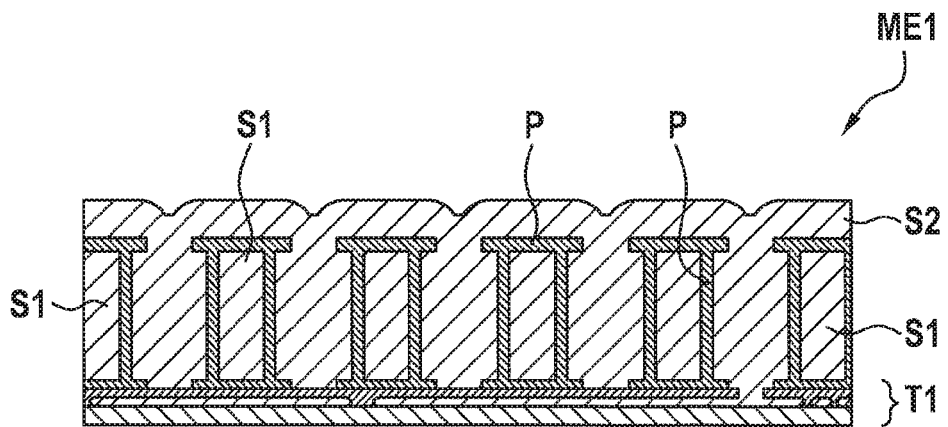
Figure 6:
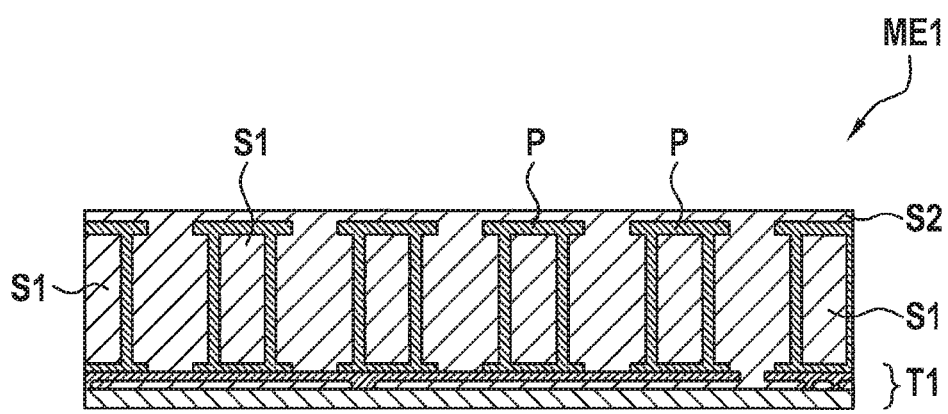
Figure 9:
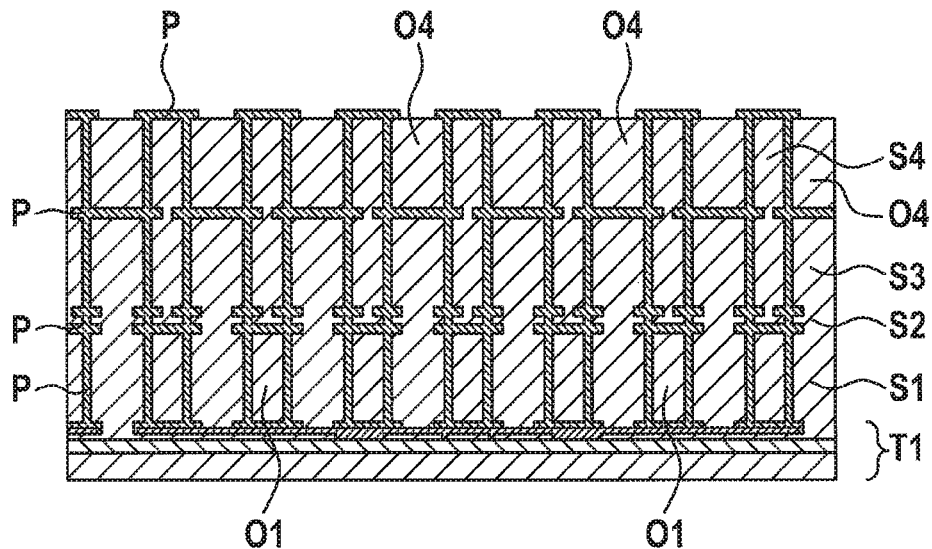

In FIG. 4, passivation layer P is structured, sacrificial areas O1 and functional areas F1 forming in first silicon layer S1, sacrificial areas O1 being free of passivation layer P, at least at some points, on a side facing away from carrier substrate T1 (see FIG. 9). The points in a third dimension, which may be free of the passivation layer, are not shown in the two-dimensional depiction from FIG. 4. It goes without saying, however, that these may be located in the third dimension of the microelectromechanical structure.

In other words, sacrificial areas O1 and functional areas F1 are separated from one another by suitably narrow trenches G. In this case, sacrificial areas are removed by subsequent sacrificial area- or sacrificial layer-etching, functional areas or functional elements are retained after sacrificial area structuring or sacrificial layer structuring. The lateral extension or the width of the trenches is dependent upon the subsequent passivation or closure technique.

Narrow trenches of between 1 to 4 micrometers are advantageous; these are passivated by thermal oxidation and/or are closed/filled using TEOS deposition. This means, contact points between a surface of silicon layer S1 and subsequent silicon layers S2, S3, S4 may be established via the structuring of passivation layers P. These contact points are utilized either for the electrical, mechanical contacting or connection of two silicon sacrificial areas or silicon sacrificial planes. Depending on the etching medium, the etching rate differences between silicon layer S1, S2, S3, S4 and passivation layer P differ, so that alternative passivation materials for passivation are also possible, for example, $Si_xN_y$, SiC, SiCN or SiON.

In particular, contact may be established in the areas, which are free of passivation layer P, i.e., the silicon surface, using a CVD (chemical gas phase deposition) polysilicon deposition. The polysilicon may be utilized as a thin wiring plane or as a starting layer for thicker epitaxial silicon layers or epi-polysilicon layers. Alternatively, epitaxy may also be carried out directly without a polysilicon layer by selecting a process control in which crystallization nuclei form on their own.

In FIGS. 5 through 8, the method steps described with the aid of FIGS. 1 through 4 are correspondingly repeated, whereby a second or nth epitaxially grown silicon layer S2, . . . , $S_n$ is formed.

Figure 7:
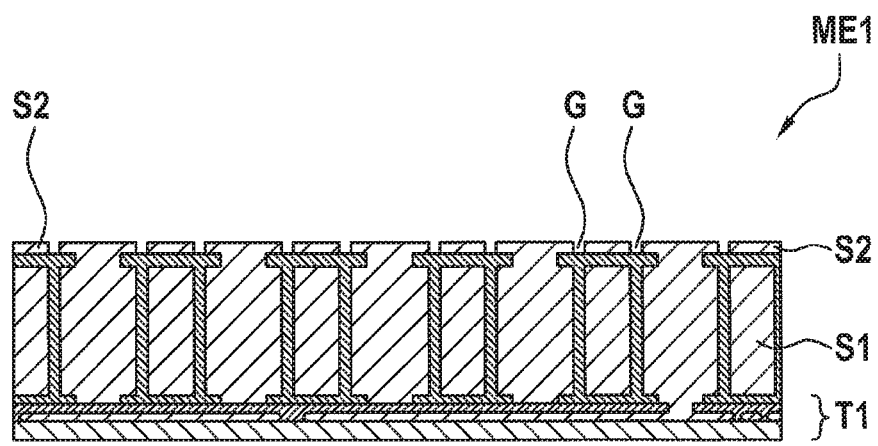
Figure 8:
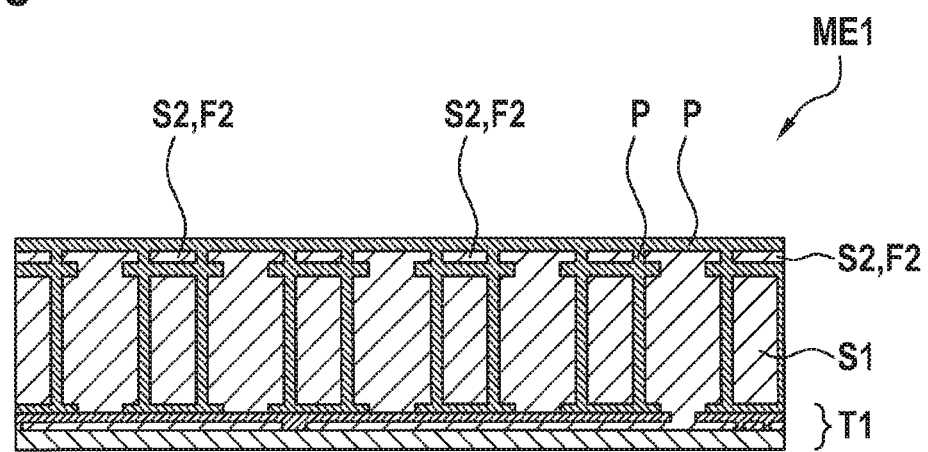

It should be mentioned that, in particular, a developing, elevated roughness or unevenness during epitaxic deposition of thicker silicon layers may be advantageously reduced or planarized, as described above, using a CMP process (see FIGS. 5 and 6). Existing silicon layers may be changed in terms of their electrical conductivity by suitable doping methods, for example, in situ or by implantation or diffusion. As shown in FIGS. 7 and 8, the existing second silicon layer S2 may now be subdivided, in turn, into sacrificial areas and functional areas F2 by structuring or by forming trenches, independently of the subjacent subdivision of first silicon layer S1.

Figure 10:
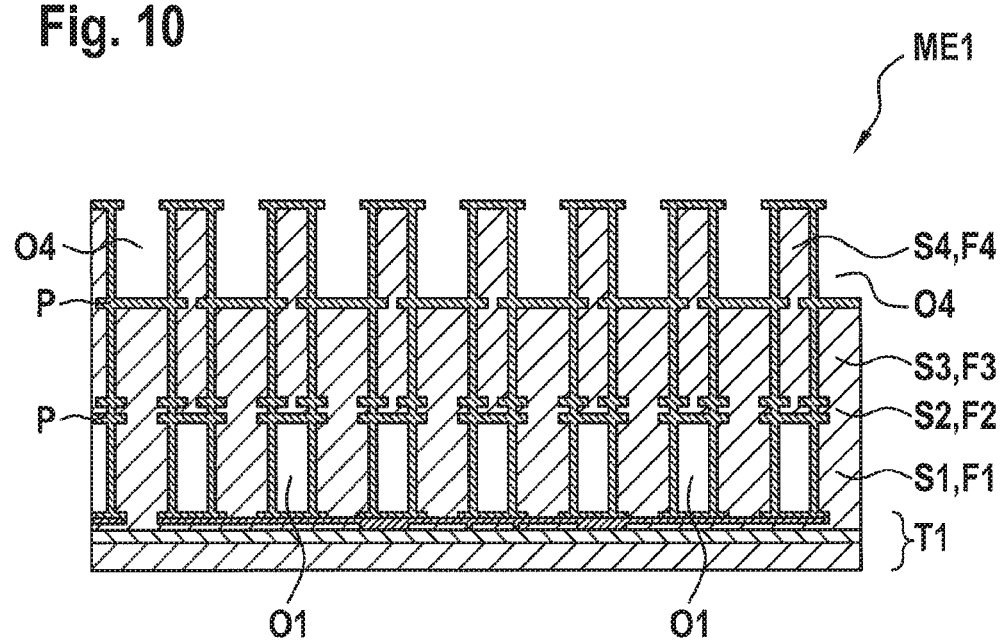

In FIG. 9, reference numerals S1, S2, S3, S4 label manufactured epitaxially grown silicon layers according to the method according to the invention. Due to the above-described structuring of corresponding silicon layers S1 through S4 and their passivation, sacrificial areas O1 and O4, are formed, as shown in FIG. 10, which may be removed by etching. Correspondingly, the silicon planes include silicon layers S1 through S4, each silicon layer S1 through S4 having corresponding sacrificial areas (with sacrificial areas O1 and O4 being designated in the drawings) and functional areas F1 through F4 in each plane.

Figure 11:
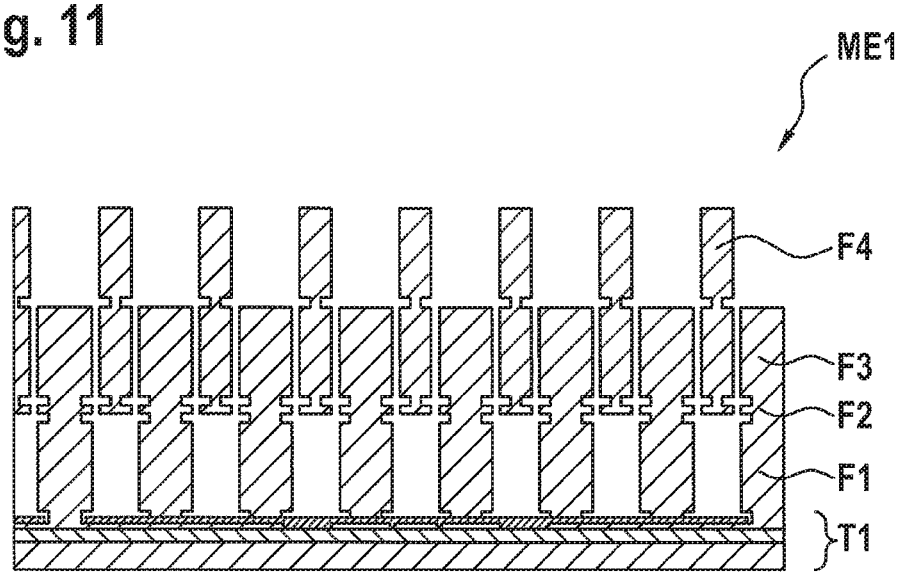

FIG. 11 differs from FIG. 10 in that passivation layer P was additionally removed using an etching method. As shown in FIG. 11, functional areas F1 through F4 are fixed with respect to one another in such a way that microelectromechanical structure ME1 is maintained even without passivation layer P.

It goes without saying that a subdivision into sacrificial areas O1 through O4 and functional areas F1 through F4 of epitaxially grown silicon layers S1 through S4 described here does not have to be carried out imperatively. Each of the silicon layers S1 through S4 may rather also function completely as a functional area or a functional layer. A determination or definition of sacrificial areas rather depends on the desired microelectromechanical structure of the layer sequence and its subsequent function.

In order to implement mechanical connections in combination with simultaneous electrical insulation in the functional areas, for example, for wiring planes, the use of a second dielectric may be advantageous, which is ideally attacked not at all or only slightly during the etching of passivation layer P or silicon layers S1 through S4. When F-plasma/$XeF_2$ and HF are utilized as etching media, silicon nitride, for example, may be utilized as a second dielectric, alternatively to an oxide.

Silicon nitride portions, similarly to the functional areas, must be protected against $XeF_2$ by the passivation layer P. Other dielectrics may also be utilized, in particular. The arrangement of a second dielectric within the layer sequence described here may result depending on the selectivity with respect to the etching media. The following connections between two stacked layers may therefore be created:

Functional silicon/functional silicon (direct connection, electrically conductive)

Functional silicon/functional silicon (only a mechanical connection via a dielectric)

Functional silicon/sacrificial silicon (and vice versa; connection via a dielectric, which is etched not at all or only slightly during etching of the sacrificial areas)

Sacrificial silicon/sacrificial silicon (direct connection)

The further configuration to form a complex 3D-structure (e.g., complex MEMS structures such as acceleration sensors, rotation rate sensors, micromirror devices, etc.) is carried out by repeating the corresponding, aforementioned method steps, whereby sacrificial and functional layers produced by epitaxial growth may differ from one another in terms of freely selectable layer thicknesses. Layer thicknesses of the epitaxial or polyepitaxial silicon layers of 0.5 to 100 micrometers are advantageous. Thin silicon layers are suitable, for example, as elastic elements for vertical deflections (e.g., suspensions, spiral springs, diaphragms, etc.), thick silicon layers are advantageous for manufacturing electrode combs or for filling large volumes or for removing these, as sacrificial areas.

Figure 12:
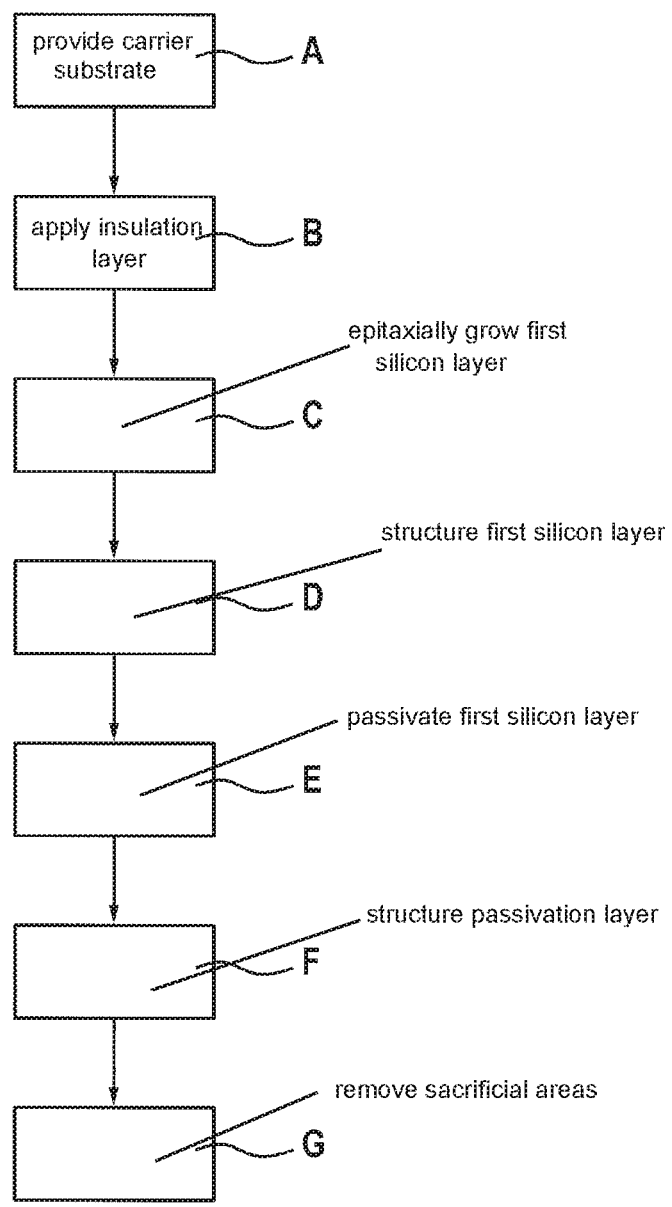
FIG. 12 shows a schematic flow chart for explaining a method according to one specific embodiment of the present invention for manufacturing microelectromechanical structures in a layer sequence.

FIG. 12 shows a schematic flow chart for explaining a method according to one specific embodiment of the present invention for manufacturing microelectromechanical structures in a layer sequence.

In a first step A, a carrier substrate T1 is provided including a first surface 10. In a second step B, an insulation layer I1 is applied onto first surface 10. In a step C, an epitaxial growth of a first silicon layer S1 onto insulation layer I1 takes place. In a further step D, a structuring of first silicon layer S1 is carried out in order to form trenches G in first silicon layer S1, trenches G extending through first silicon layer S1, at least at some points. Subsequently, in a step E, first silicon layer S1 is passivated, trenches G are filled and a passivation layer P is formed on a side facing away from the first surface. In a next step F, passivation layer P is structured, sacrificial areas O1 and functional area F1 are formed in first silicon layer S1, and sacrificial areas O1 are free of passivation layer P, at least at some points, on a side facing away from the carrier substrate.

Subsequently, in a step G, the sacrificial areas are removed, for example, by etching.

Method steps A through G shown in FIG. 12 may be carried out, in particular, according to the sequence shown in FIG. 12.

Over all, an efficient and cost-effective method for manufacturing microelectromechanical structures in a layer sequence and an electronic component having a micromechanical structure may therefore be created.

What is claimed is:

1. A method for manufacturing microelectromechanical structures in a layering sequence, comprising:
    providing a carrier substrate including a first surface;
    applying an insulation layer onto the first surface;
    epitaxially growing a first silicon layer onto the insulation layer;
    structuring the first silicon layer by forming trenches in the first silicon layer, trenches extending through the first silicon layer, at least at some points;
    passivating the first silicon layer, whereby the trenches are filled and a passivation layer is formed on a side facing away from the first surface;
    structuring the passivation layer, whereby sacrificial areas and functional areas are formed in the first silicon layer, and the sacrificial areas are free of the passivation layer, at least at some points, on a side facing away from the carrier substrate;
    removing the sacrificial areas, wherein the epitaxially growing, structuring, and passivating of the first silicon layer, and the structuring of the passivation layer are repeated to produce a second silicon layer vertically stacked over the first silicon and containing at least one further functional area that is vertically stacked over and integrally joined with a functional area of the first silicon layer; and
    completely removing every passivation layer.

2. The method as recited in claim 1, wherein the repeating of the epitaxially growing, structuring and passivating of the first silicon layer, and the structuring of the passivation layer is performed prior to the removing of the sacrificial areas and a formation of further sacrificial areas and further functional areas depends upon the structuring of the further silicon layers and of the further passivation layers.

3. The method as recited in claim 1, wherein, after the removing of the sacrificial areas, a removal of the passivation layer, at least at some points, is carried out.

4. The method as recited in claim 1, wherein the epitaxial growth of the first silicon layer takes place on an SOI (silicon-on-insulator) substrate or the SOI substrate includes the first silicon layer.

5. The method as recited in claim 1, wherein the first silicon layer includes at least one of a monocrystalline, polycrystalline, and an epi-polycrystalline silicon layer.

6. The method as recited in claim 1, wherein a layer thickness of the first silicon layer is between 0.5 and 100 micrometers.

7. The method as recited in claim 6, wherein the layer thickness of the first silicon layer is between 20 to 60 micrometers.

8. The method as recited in claim 1, wherein the insulation layer functions as an etch-stop layer.

9. The method as recited in claim 1, wherein the trenches are formed with the aid of a trench process.

10. The method as recited in claim 1, wherein the structuring of the passivation layer is carried out using at least one of a dry etching method and a wet etching method.

11. The method as recited in claim 1, wherein, after the epitaxial growth of the first silicon layer, at least one of the following is performed:
    i) a chemical-mechanical polishing, and
    ii) an additional doping by implantation or diffusion.

12. The method as recited in claim 1, wherein, the removal of the sacrificial areas is carried out by at least one of plasmaless and plasma-supported etching.

13. The method as recited in claim 1, wherein a horizontal width of the further functional area is the same as a horizontal width of the functional area of the first silicon layer.

* * * * *